United States Patent [19]

Torick et al.

[11] Patent Number: 4,485,483

[45] Date of Patent: Nov. 27, 1984

[54] FM STEREOPHONIC SYSTEM INCORPORATING COMPANDING OF DIFFERENCE SIGNAL

[76] Inventors: Emil L. Torick, Morehouse La., Darien, Conn. 06820; Thomas B. Keller, 6721 Clelia Ct., Springfield, Va. 22152

[21] Appl. No.: 476,738

[22] Filed: Mar. 18, 1983

[51] Int. Cl.³ ............................................. H04H 5/00
[52] U.S. Cl. ......................................... 381/14; 381/4
[58] Field of Search ................... 332/17, 21, 22, 23 A, 332/40, 44, 48; 333/14; 381/2-6, 12, 14-16, 7-11, 13

[56] References Cited

U.S. PATENT DOCUMENTS

| | | | |
|---|---|---|---|
| 3,067,292 | 12/1962 | Minter | 381/2 |
| 4,016,366 | 4/1977 | Kurata | 381/5 |
| 4,338,491 | 7/1982 | Parker et al. | 381/16 |
| 4,376,916 | 3/1983 | Glaberson | 330/136 |

FOREIGN PATENT DOCUMENTS 1093961 12/1967 United Kingdom ................... 381/2

OTHER PUBLICATIONS

Fockens et al., "A Quadraphonic FM Broadcasting System Incorporating Pilot-Controlled Compression and Pre-Emphasis", IEEE Transactions on Consumer Electronics, vol. CE-22, No. 1, pp. 84-93, Feb. 1976.
Recommendations and Reports of the CCIR (1982), vol. X, Part 1, Report #300-5, Paragraph 3.3.
Stereophonic Broadcasting, European Broadcasting Union, CCIR Document X/42-E, 2/23/65, Part Three, pp. 10-12.
A/B Field Tests of Stereophonic Broadcasting Systems, United States of America, CCIR Document X/149-E, 5/7/69, pp. 1-11.

Primary Examiner—Gene Z. Rubinson
Assistant Examiner—W. J. Brady
Attorney, Agent, or Firm—Spencer E. Olson

[57] ABSTRACT

An FM stereophonic radio broadcasting system in which stereophonically related audio frequency source signals L and R are matrixed to obtain stereophonic sum and difference signals M and S, respectively. At the transmitter, the difference signal, is compressed, and the conventional difference signal and the compressed difference signal modulate respective quadrature-related sub-carriers of the same frequency to develop two double-sideband, suppressed-carrier signals, the frequency of the sub-carriers being sufficiently high as to assure a frequency gap between the lower sidebands of the modulated sub-carrier signals and the sum signal M. The M signal, the aforementioned suppressed-carrier signals, and a pilot signal having a frequency which lies within the frequency gap, are combined and frequency-modulated onto a high frequency carrier for the purpose of transmitting the same to one or more remote receivers. The receiver includes an expander for complementarily expanding the received compressed difference signal, and the expanded noise-reduced difference signal is combined with the received sum signal to reproduce the audio frequency source signals L and R. The system increases the broadcast coverage area over that of current biphonic service yet is compatible with existing monophonic and biphonic receivers.

20 Claims, 8 Drawing Figures

FM STEREOPHONIC SYSTEM INCORPORATING COMPANDING OF DIFFERENCE SIGNAL

BACKGROUND OF THE INVENTION

This invention relates to FM stereophonic broadcasting systems and, more particularly, an improved FM stereophonic broadcasting system which increases the broadcast coverage area over that of current biphonic service yet is compatible with existing monophonic and biphonic receivers.

The potential of FM sound broadcasting has long been recognized, and because of its relative immunity to electromagnetic interference and its ability to provide full audio bandwidth with low noise, was also selected as the transmission method for television sound. Although FM radio was hardly a universal success in the commercial sense when stereophonic broadcasts were first authorized in 1961, it was not long before the attraction of two-channel high-fidelity sound elevated FM to the status it enjoys today. However, although FM-stereo adds a new acoustical dimension to radio reception, it does so only at the expense of serious degradation of another high fidelity parameter, namely, the signal-to-noise ratio.

The noise penalty in stereophonic broadcasting is well known; less obvious, however, is the restrictive influence this phenomenon has on station coverage, which, for equivalent signal-to-noise ratio, typically may be only one fourth or one fifth the area of simple monophonic broadcasts. Several factors constribute to the higher noise levels and coverage losses resulting from multi-channel sound transmissions. When a broadcast station converts to biphonic service, monophonic coverage is reduced because signal power must be divided among the various components of the more complex baseband signal. (The term "biphonic" will be used hereinafter in order to clearly differentiate two-channel broadcasting from other forms of stereophony such as triphonic and quadraphonic broadcasting.) The biphonic signal-to-noise ratio is lower than monophonic signal-to-noise ratio because of the wide band width of the composite signal having the familiar equation $$f(t) = M + p \sin \omega/2\, t + S \sin \omega t \qquad \text{Eq. (1)}$$

where M is the monophonic sum signal, p is the pilot, and S is the stereophonic difference signal. With a baseband spectrum extending to 53 kHz for biphonic transmissions, the noise level is particularly high because of the rising spectral characteristic due to frequency modulation. As shown in FIG. 1, the so-called "triangular" noise spectrum increases 6 dB per octave with increasing frequency of the composite-signal. Audio de-emphasis counteracts this somewhat as shown in FIG. 1, but the noise probem is still severe. After demodulation, the noise components of the difference channel subcarrier are added, statistically independent, to the noise already present in the monophonic signal during audio dematrixing.

Any precise computation of the theoretical loss of signal-to-noise ratio must taken into account factors such as the effect of de-emphasis, the format of the audio test signal (which is assumed for the computation), and interleaving. Interleaving is the interesting phenomenon whereby with certain audio signals the peak amplitude of the sum of the main channel signal and the sub-channel signal may be less than the sum of the peak amplitudes of these channels, thus permitting the interleaved signals to be raised to full modulation, with a resultant improvement in the signal-to-noise ratio. These factors have been studied by a number of researchers, and a calculation of the signal-to-noise degradation in biphonic broadcasting was published by N. Parker and D. W. Ruby in a 1962 paper entitled "Some notes on the calculation of the S/N Ratio For a FM System employing a double sideband AM multiplexer signal", IEEE Trans. Broadcast Television Receivers (International Convention Issue), vol. BTR-8, pp. 42–46, April 1962. The authors assumed the transmission of the peak monophonic power available, i.e., no modulation of the subcarrier ($L - R = 0$); while their report of 23 dB degradation has received widespread acceptance, the figure is not entirely representative of typical programming. More recently, undr EIA auspices, the subject has been studied in greater detail by the National Quadraphonic Radio Committee (NQRC) and in its final report to the Federal Communications Commission, vol. II, Chapter 1, section 1.4, November 1975, by J. Gibson, et al, entitled, "Signal And Noise Levels In Proposed Multiplexed Systems For FM Broadcasting Of Quadraphonic Sound", reaffirmed the 23 dB penalty for a monophonic test signal, but also, by virtue of using a wide variety of audio test signals, demonstrated that a penalty of 26 dB is more representative of stereophonic programming with wide audio separation. For monophonic receivers, the NQRC data predict noise degradation of 1 dB to 7 dB, depending on the paticular type of test signal used.

Such losses of signal-to-noise ratio also cause a reduction in the effective area of coverage of a broadcast station; this effect for a representative set of transmission and reception conditions, based on NQRC data published Jan. 15, 1976 as a Supplement to the aforementioned report of the NQRC to the FCC entitled, "Illustrations to Relations Between Signal-To-Noise Ratio and Range in Existing FM Broadcast Services And Proposed Systems For FM Broadcasting of Quadraphonic Sound", is illustrated in FIG. 2. As a basis for this illustration, the NQRC used the FCC FM Engineering charts for the estimated field strength exceeded at 50% of the potential receiver locations for at least 50% of the time with a dipole receiving antenna height of 30 feet. The transmitter height was assumed to be 1,000 feet with a 10 kilowatt effective radiated power at 98 MHz, and the receiver was assumed to have a 10 dB noise figure. For reception at a signal-to-noise ratio of 50 dB, the limit of station coverage would extend to a radius of 128 miles when monophonic transmission only is employed. However, with biphonic transmission, two-channel reception extends only to a 60-mile radius, and monophonic reception is reduced to 100 miles. Although in reality station service areas are often limited by co-channel and adjacent-channel interference rather than by noise, FIG. 2 represents a useful comparison of the theoretical limits.

A potential solution of the noise penalty problem is the use of companding systems which achieve noise reduction by compressing the dynamic range of an audio program before transmission and expanding it to its original dynamic range at the receiver, the effect of which is illustrated in FIG. 3. The "original program" signal, with a wide dynamic range and a low noise level is represented at the left of the figure, and in the center the program is shown compressed to approximately one-half its original dynamic range for transmission purposes. During transmission, additional noise is introduced at a level below that of the compressed program, but at a level which would have intruded on the program had it not been compressed. Finally, the "expanded program" is shown at the right reconstituted to its original dynamic range and with the transmission noise simultaneously reduced to an unobtrusive level. Companding systems exhibiting these properties have achieved success in various audio applications, including tape and disc recording. For its potential application to broadcasting, tests were conducted in Sweden in the early 1960's utilizing a companding system in the S channel of FM-AM and FM-FM transmission systems; favorable results were reported for the FM-FM transmissions, although the system was never fully implemented. The results are briefly described in Vol. X, Report 300-3, "Stereophonic Broadcasting," of the XIIIth Plenary Assembly, International Radio Consulative Committee (CCIR), Geneva, 1974. Significant improvements in companding systems have been achieved during the last 20 years, and there is now renewed interest in the application of companding in broadcast systems as exemplified by the current examination by the Multichannel Sound Committee of the Broadcast Television Systems Committee of the potential application of companders to the S channel for television audio.

Given the recent advances in the art of audio companding, it is also appropriate to again examine its potential application to FM radio broadcasting. Currently, some broadcasters utilize Dolby-type encoding to provide modest noise reduction in receivers equipped with appropriate expanders and, relatively acceptable playback with simple receivers not having expanding capability. However, the requirement that compatibility with simple receivers must be maintained inhibits the potential for truly significant noise reduction in the other (expander-equipped) receivers.

SUMMARY OF THE INVENTION

It is a primary object of the present invention to provide an improved biphonic FM radio broadcasting system that is fully compatible with existing receivers and which achieves better noise reduction than in prior systems.

A related object of the invention is to provide an improved FM radio broadcasting system that will extend the area of coverage of an FM broadcasting station.

In accordance with the present invention, a pair of stereophonically related audio frequency waves characterized as L (left) and R (right) are matrixed to obtain two signals exhibiting the matrix equations: (1) $M=L+R$, and (2) $S=L-R$. The difference signal, S is applied simultaneously to a modulator where it is used to amplitude-modulate a first sub-carrier signal and to a compressor which compresses its dynamic range to produce a compressed signal $S'$. The compressed signal $S'$ is used to amplitude-modulate a second sub-carrier signal of the same frequency but in quadrature phase relationship with the first. Suppressed-carrier, double-sideband modulation of each subcarrier is employed, with the frequency of the subcarrier signals being sufficiently high as to assure a frequency gap below the lower sidebands of the modulated subcarrier signals and the M signal. A conventional low-level phase reference pilot signal, lying within the aforementioned frequency gap, is employed for receiver detection purposes. The aforementioned M signal, the two double-sideband suppressed-carrier signals, and the pilot signal are frequency modulated onto a high frequency carrier for transmission purposes.

The composite, frequency modulated carrier signal is transmitted to one or more remote receivers, which may be of the conventional monophonic or two-channel stereophonic type, or preferably a receiver constructed in accordance with the invention so as to include an expander for expanding the compressed S signal. The composition of the transmitted signal is such that a conventional monophonic receiver decodes only the sum signal M, and a two-channel receiver reproduces the transmitted M signal in both loudspeakers for monophonic reception, and the traditional stereophonic signals for the biphonic mode. A new class of receiver, for providing substantially noise-free biphonic reception, reproduces the transmitted sum signal M and the expanded stereophonic difference signal.

BRIEF DESCRIPTION OF THE DRAWINGS

The invention will be more fully appreciated from the following detailed description when considered in connection with the accompanying drawings in which.

DETAILED DESCRIPTION

Figure 1:
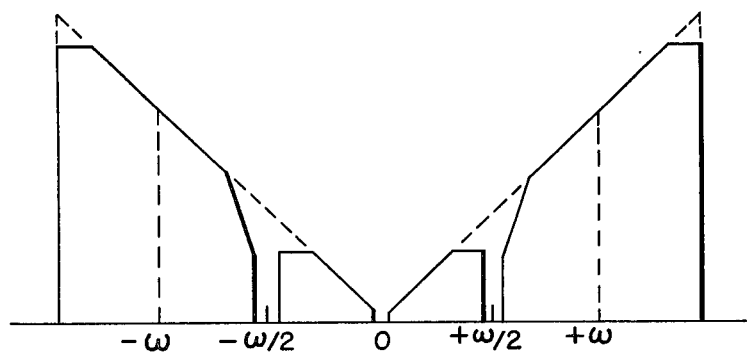
FIG. 1, to which reference has already been made, is a plot of the FM noise spectrum with de-emphasis.
Figure 2:
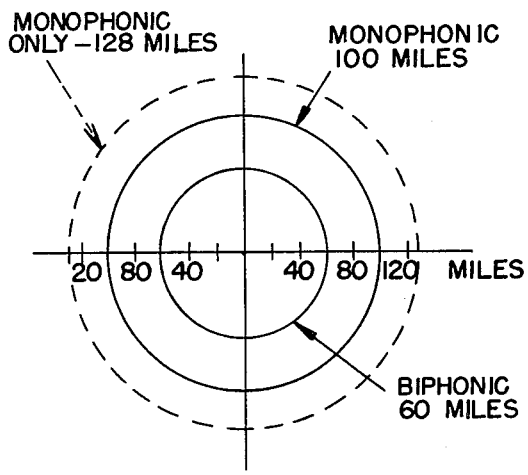
FIG. 2, to which previous reference has been made, is a plot showing the reception limits for a 50 dB signal-to-noise ratio.
Figure 4:
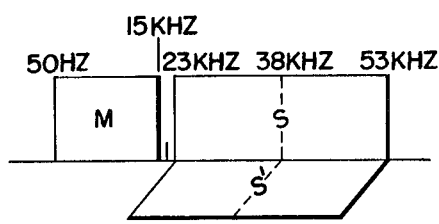
FIG. 4 is a frequency diagram of the composite baseband signal developed in accordance with the principles of the present invention.
Figure 3:
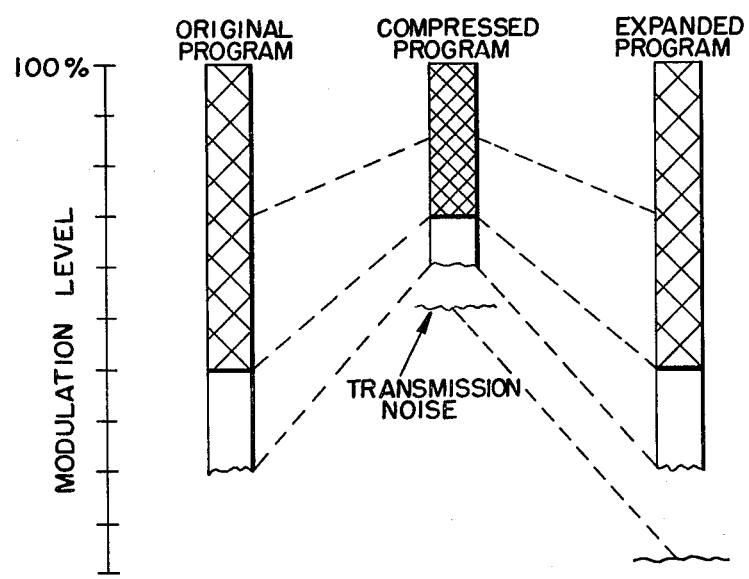
FIG. 3, previously referred to, is a chart which illustrates the principle of signal companding.

As background for the present invention, it will be useful to briefly review the basic principles of the existing two-channel stereo system approved by the FCC. In the current FM radio system, the stereophonically related signals that are added together, constitute a "monophonic sum channel" which consists of a (L+R) signal of 50 to 15,000 Hz, where L and R represent the left and right independent audio signals, each of which may also include a 0.7 C "center" component. It is this combined signal that is reproduced by a standard monaural FM receiver, hence the descriptive term "monophonic channel" and the use herein of the letter M to identify this channel. To this is added a double-sideband suppressed 38 kHz sub-carrier signal S sin $\omega t$, where $S=(L-R)$, along with a 19 kHz pilot signal. The composite modulation signal can be written as:

$$e_m = M + p \sin \omega/2\, t + S \sin \omega t \qquad \text{Eq. (2)}$$

where $\omega = 2\pi f_s$ and $f_s = 38$ kHz, and p is the amplitude of the 19 kHz pilot. Looking at the baseband spectrum, one finds a monophonic channel M from about 50 Hz to 15 kHz, a 19 kHz pilot, and a stereophonic channel S sin $\omega t$ signal from 23 to 53 kHz. If SCA (Subsidiary Communication Authorization) is also being transmitted, there would be an SCA frequency modulated subcarrier band in the region above 53 kHz and below 75 kHz. In accordance with the present invention, a compressed S channel (hereinaftr designated S') is transmitted in addition to the just-described signal. The additional S' channel preferably is transmitted in quadrature with the conventional stereophonic subcarrier to produce the composite baseband signal illustrated in FIG. 4 and represented by the following equation:

$$e_m = M + p \sin \omega/2\, t + S \sin \omega t + S' \cos \omega t \qquad \text{Eq. (3)}$$

where p represents the amplitude of the pilot signal and $\omega = 2\pi \cdot 38$ kHz. The quadrature subcarrier requires no additional spectrum space, and, as will be shown hereinafter, imposes only a negligible penalty in modulation potential.

Figure 5:
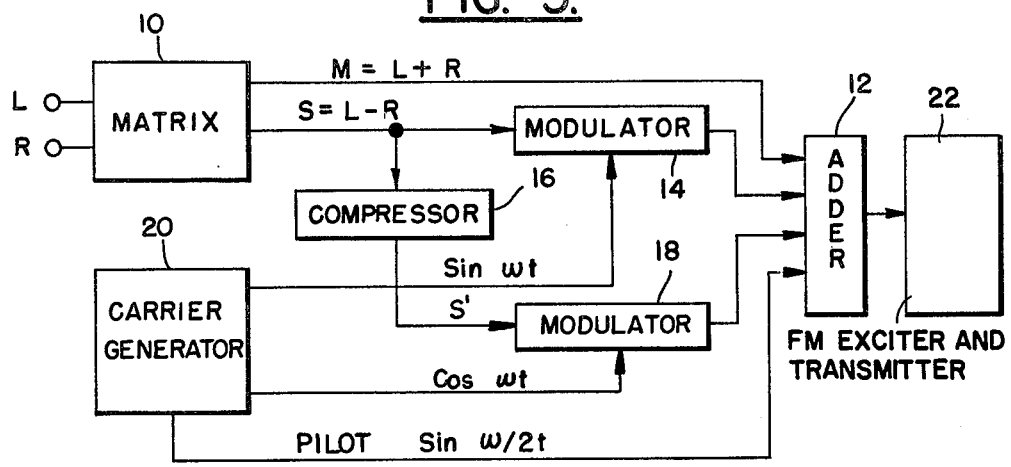
FIG. 5 is a simplified block diagram of a transmitting terminal for generating the composite signal of FIG. 4.

The transmitter for generating this composite signal is illustrated in the block diagram of FIG. 5. For purposes of simplicity, some of the more conventional transmitter circuits (e.g., pre-emphasis networks, carrier frequency source, and carrier frequency modulator) have not been shown in detail and will be mentioned only briefly, where necessary, in the following description. The two audio frequency signals L and R, derived from separate sources (not shown), are applied by pre-emphasis networks (not shown) to the inputs of a conventional matrix network 10 consisting, for example, of a network of summing amplifiers arranged to produce at the output of the matrix the two audio signals $M = (L+R)$ and $S = (L-R)$. The monophonic signal, M, is applied aas one input to an adder 12, and the stereophonic difference signal $(L-R)$ is applied to the input of a modulator 14, the output of which is applied to adder 12, and also to the input of a compressor 16 of a suitable noise-reducing companding system. An eminently suitable compressor is described in commonly assigned U.S. Pat. No. 4,376,916 entitled "Signal Compression and Expansion System". Briefly, the compressor (and expander) described therein is of the type which includes a variable gain device for controlling the gain of the input signal and a circuit for generating a control signal for the variable gain device including a rectifier for producing responsively to the input signal a DC signal which substantially follows dynamic variations of the input signal. The control signal generating circuit includes a network of at least three signal paths having differing time constants, the network having a common input terminal for receiving the rectified signal and a common output terminal connected to the variable gain stage for coupling the control signal thereto. All except one of the signal paths each includes means for causing the respective path to be conductive only in response to the rectified signal exhibiting a change in amplitude sufficient to exceed a predetermined voltage, and the said one signal path conducts in response to any differential in voltage between the common input and output terminals.

The compressed stereophonic difference signal from compressor 16, designated S', is applied to the input of a second modulator 18, the output of which is also delivered to adder 12 where it is linearly combined with the monophonic signal M and the signal from modulator 14.

The subcarrier and pilot signals are derived from a carrier generator 20 which is designed to provide an output sine wave signal having a frequency of 38 kHz and includes any one of the known arrangements for providing a 90° phase displacement between the subcarrier output signals applied to the respective modulators 14 and 18, as indicated in FIG. 5. The modulators 14 and 18 comprise suppressed-carrier amplitude modulators of known construction which serve to amplitude-modulate the two subcarriers with respective audio frequency signals so as to produce the two double-sideband, suppressed-carrier, amplitude-modulated subcarrier signals $S \sin \omega t$ and $S' \cos \omega t$. These two signals are then combined in adder 12 with the monophonic signal M and a sine wave pilot signal having a frequency of 19 kHz derived from carrier generator 20. The composite signal produced at the output of adder 12, set forth in Equation (3) above, is then applied to the FM exciter of a transmitter 22 and frequency modulated onto a high frequency carrier for transmission purposes.

Figure 6:
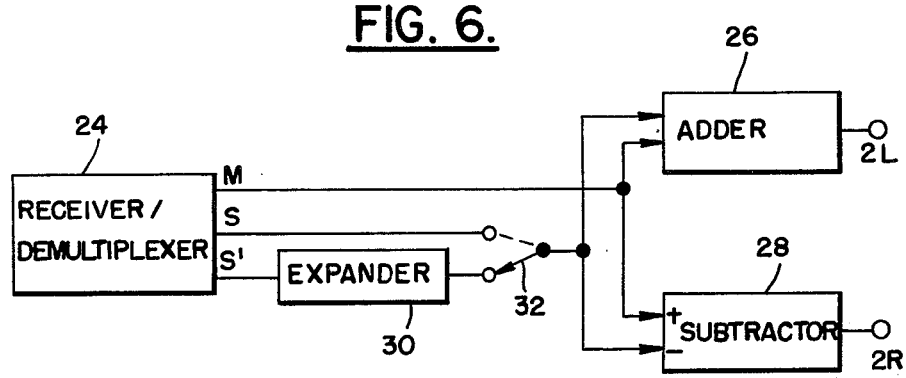
FIG. 6 is a simplified block diagram of a receiving terminal constructed in accordance with the invention.

A receiver according to the invention is shown in the block diagram of FIG. 6 and, again, for purposes of simplicity some of the more conventional FM receiver circuits (e.g., RF and IF stages, discriminator, and de-emphasis networks) have not been shown and will be only briefly mentioned as necessary. In addition to having the capability of achieving maximum noise reduction, in the manner to be described, the receiver is fully compatible with conventional monophonic and two-channel (biphonic) stereophonic broadcasts. A received FM signal is amplified in the RF and IF stages (not shown) of a receiver/demultiplexer 24, and demodulated in any of the known FM detection circuits (not shown) and demultiplexed to derive the audio signals contained in the received FM signal, namely, the signals M, S, and S'. When a monaural broadcast is being received, the output of the demultiplexer comprises only the monaural signal M consisting of $(L+R)$. This signal is applied as a first input to an adder 26 and to the positive input of a subtractor 28, and since no signal is applied to the second input of adder 26 nor the negative input of subtractor 28, the monophonic M signal (i.e., $(L+R)$) appears at the output of each of adder 26 and subtractor 28 which are applied to the left and right loudspeakers, respectively.

For a received conventional two-channel stereo signal, the M and S signals will be derived at the output of the demultiplexer 24; as before, the M signal is applied to one input of each of adder 26 and subtractor 28, and the S signal, when a switch 32 is in the dotted line position, is subtracted from the M signal in subtractor 28. As a result, the output of adder 26 is the signal 2L, the amplitude of which is then reduced by one-half to obtain a signal L for application to the left loudspeaker (not shown). Similarly, subtraction of the difference signal $(L-R)$ from the monophonic signal yields a signal 2R which, again, is reduced in amplitude by one-half for reproduction by the right loudspeaker (not shown) of the two-channel system. All of the above is typical of the mode of operation of a conventional two-channel FM receiver.

To achieve improved signal-to-noise ratio and extend the area of coverage of the system, the compressed difference signal S' is applied to the input of an expander 30 which exhibits complementarity with the compressor 16 in the transmitter for expanding the compressed signal to its original dynamic range, and this expanded signal, when switch 32 is in the position shown, is applied to the second inputs of adder 26 and subtractor 28. As in the case of the S signal, adder 26 and subtractor 28 produce the signals 2L and 2R at their respective outputs and these are then reduced in amplitude for reproduction by the left and right loudspeakers, respectively. Preferably the switch 32 is automatically actuated from its dotted line position when there is no compressed difference signal at the output of demultiplexer 24 to the solid line position when the received signal contains a compressed difference signal. Such automatic switching can be achieved, for example, by either of the known techniques of modulating the pilot tone, or adding a separate identification signal, when a compressed difference signal is transmitted; a detector in the receiver responsive to the identification signal produces a signal for actuating the switch 32 from the dotted line position to the position shown in FIG. 6.

The penalty in dB signal-to-noise provided by the addition of the companded-biphonic (C-biphonic) channel is compared with the performance of conventional monophonic and biphonic transmissions in the following table.

| Modulating Signal | Transmission Mode | Receiver State | | |
|---|---|---|---|---|
| | | Monophonic | Biphonic | C-Biphonic |
| L + R Only | Monophonic | 0 | N.A. | N.A. |
| | Biphonic | 0.92 | 23.11 | N.A. |
| | C-Biphonic | 0.92 | 23.11 | 0.92 |
| L (or R) Only | Monophonic | 0 | N.A. | N.A. |
| | Biphonic | 6.94 | 26.12 | N.A. |
| | C-Biphonic | 8.58 | 27.76 | 8.58 |

The table, based on NQRC calculations, shows the predicted performance for various combinations of the three transmission and receiving modes. The comparison is made with two different test signals: a (L+R) signal equivalent to that used by Parker and Ruby, and L (or R) only, representative of most of the NQRC calculations. For either modulating signal, compressed-biphonic reception can be as good as equivalent monophonic reception if an ideal companding system is employed, i.e., sufficient noise reduction is achieved in the S' channel to allow the noise of the M channel to predominate.

Figure 7:
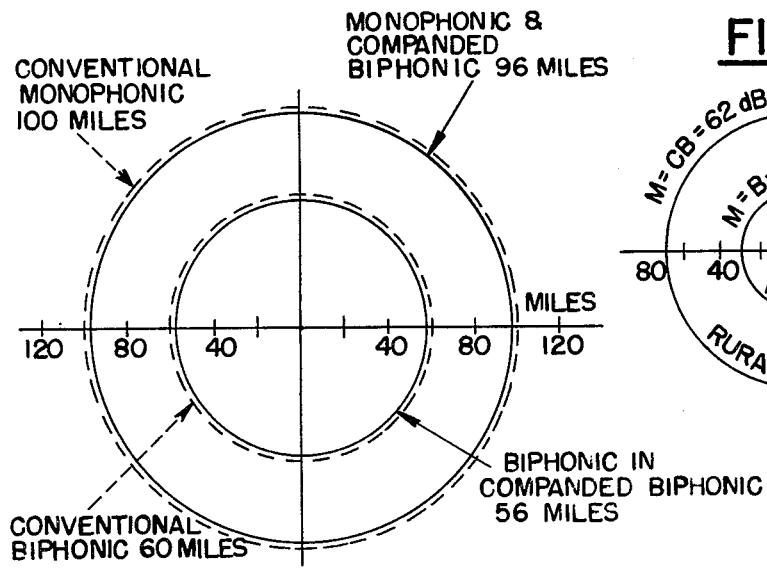
FIG. 7 is a plot showing reception limits for a 50 dB signal-to-noise ratio in a FM radio broadcasting system according to the present invention.

FIG. 7 shows a prediction of the reception range limits for a 50 dB signal-to-noise ratio with companded biphonic transmission. The NQRC method and the 50, 50 charts contained in Vol. III, Part 73.333 of the FCC Rules and Regulations were used in developing this plot. It is seen that compared with conventional biphonic transmissions, the improved companded system causes a relatively insignificant reduction of monophonic reception from a 100 mile radius to a 96 mile radius, and a similarly modest reduction of biphonic reception from 60 miles to 56 miles. However, the improved companded biphonic service would extend all the way to the monophonic contour at 96 miles, which represents approximately a three-fold increase in coverage area over the existing biphonic service.

Figure 8:
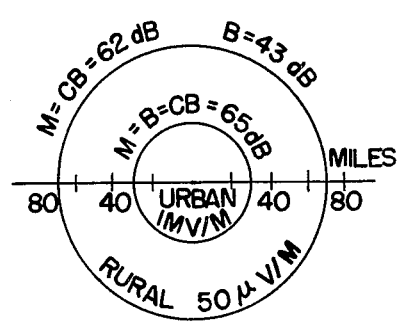
FIG. 8 is a plot showing signal-to-noise ratios at key contours.

An alternative way of displaying the signal-to-noise of various transmission schemes, also suggested by the NQRC, is illustrated in FIG. 8 wherein signal-to-noise ratios are shown at the so-called "urban" contour ($E_o = 1$ mv/M) and at the "rural" contour ($E_o = 50$ μv/M). For the conditions assumed (which are the same as for the previous figures) all systems will exhibit the same signal-to-noise performance at the urban contour. With such high field strength, reception characteristics here will be dictated only by receiver performance; typically, a signal-to-noise ratio of 65 to 70 dB may be realized. At the rural contour (70 mile radius), conventional biphonic receivers will exhibit a 43 dB signal-to-noise ratio, whereas companded biphonic receivers will achieve 62 dB.

It will be apparent from the foregoing that the improved companded service for FM ratio broadcasting offers the potential for providing service nearly equivalent to that provided by monophonic receivers. Compatibility with existing receivers can be maintained by encoding the compressed signal in a new channel which is in quadrature with the conventional S channel. The necessary transmission equipment is relatively easy and inexpensive to implement, and technology for decoding the S' channel has previously been developed for other applications such as AM stereo and FM quadraphonic reception.

We claim:

1. In a biphonic FM radio transmission system, a transmitter comprising:
   means for combining independent stereophonically related audio signals L and R to obtain audio frequency sum and difference signals M and S respectively comprising (L+R) and (L−R);
   means for compressing the dynamic range of said audio frequency signal S and producing a compressed difference signal S';
   means for generating two sub-carriers of the same frequency and spaced 90° apart in phase;
   means for amplitude-modulating each sub-carrier with a respective one of said difference and compressed difference signals S and S' to develop two double-sideband suppressed-carrier signals, the frequency of said sub-carriers being sufficiently high as to insure a frequency gap between the lower sidebands of the modulated sub-carrier signals and the said audio frequency sum signal M;
   means for generating a phase reference pilot signal having a frequency which is one-half the frequency of said sub-carriers and which lies within said frequency gap; and
   means for frequency modulating said signal M, said suppressed-carrier signals and said pilot signal onto a high frequency carrier for the purpose of transmitting the same to one or more remote receivers.

2. A biphonic FM radio transmission system comprising, in combination:
   a transmitter as defined in claim 1, and a receiver including:
   means operative in response to the reception of said modulated high frequency carrier for deriving said sum signal M, said difference signal S and said compressed difference signal S',
   means for complementarily expanding the dynamic range of said derived compressed difference signal S', and
   means for combining the expanded version of the signal S' with the derived sum signal M to obtain each of the audio frequency source signals L and R.

3. A biphonic FM radio transmission system as defined in claim 2,
   wherein said receiver further includes switch means connected to the receiver combining means for alternatively coupling a derived difference signal S instead of the expanded version of the compressed difference signal S' to said receiver combining means for enabling said receiver means for reproducing conventional two-channel stereophonic broadcasts.

4. A biphonic FM radio transmission system including a transmitter and at least one remote receiver, said system comprising:

at the transmitter means for combining independent stereophonically related audio frequency source signals L and R to obtain audio frequency sum and difference signals M and S respectively comprising (L+R) and (L−R), means for compressing the dynamic range of said difference signal S and producing a compressed difference signal S', means for amplitude-modulating each of two equal frequency quadrature-phased sub-carriers with a respective one of said difference and compressed difference signals S and S', and means for frequency modulating the aforementioned amplitude-modulated sub-carrier signals and said signal M onto a high frequency carrier for the purpose of transmitting the same to one or more remote receivers; and at the receiver means operative in response to the reception of said frequency-modulated carrier for deriving said sum signal M, said difference signal S, and said compressed difference signal S', means for complementarily expanding said derived compressed difference signal to obtain an expanded noise-reduced version of the difference signal, and means for combining the expanded noise-reduced version of the difference signal with the derived sum signal M to obtain each of said source signals L and R.

5. A biphonic FM radio transmission system as defined in claim 4, wherein said receiver further includes switch means for alternatively coupling the derived difference signal S instead of the expanded version of the difference signal to the receiver combining means for enabling said receiver means for reproducing conventional two-channel stereophonic broadcasts.

6. A receiver for use in a biphonic FM radio transmission system including a transmitter having means for combining two independent stereophonically related audio frequency signals L and R to obtain sum and difference signals M and S respectively comprising (L+R) and (L−R), means for compressing the dynamic range of said difference signal S and producing a compressed difference signal S', means for modulating each of two sub-carriers with a respective one of said difference and compressed difference signals S and S', and means for frequency modulating the aforementioned modulated sub-carrier signals and said M signal onto a high frequency carrier for the purpose of transmitting the same to one or more remote receivers, said receiver comprising:

demultiplexing means for deriving said signal M, said difference signal S and said compressed difference signals S', means for complementarily expanding said derived compressed difference signal S' to obtain an expanded noise-reduced version of the difference signal, and means for combining said expanded version of the difference signal with the derived sum signal M for obtaining said audio frequency signals L and R.

7. A receiver as defined in claim 6, wherein the receiver combining means includes first means for adding the derived sum signal M to the expanded version of the difference signal to obtain said audio frequency signal L, and second means for subtracting the expanded version of the difference signal from said derived sum signal M to obtain said audio frequency signal R.

8. A receiver as defined in claim 6, wherein said receiver further comprises:

switch means connected to the receiver combining means and operative alternatively to couple said derived difference signal S, instead of the expanded version of the difference signal, to the receiver combining means for enabling said receiver for reproducing conventional two-channel stereophonic broadcasts.

9. A receiver as defined in claim 7, wherein said receiver includes means for coupling said derived sum signal M to a first input of each of said adding and subtracting means, and switch means for alternatively coupling said derived difference signal S, instead of the expanded version of the difference signal, to a second input of each of said adding and subtracting means for enabling said receiver for reproducing conventional two-channel stereophonic broadcasts.

10. For use in an FM radio transmission system, a transmitter compatible with conventional monophonic and two-channel stereophonic broadcasts and capable of improving the signal-to-noise ratio of a transmitted signal when received and processed at a remote receiver as compared to the conventional stereophonic FM system thereby to effectively extend the listening area beyond that reached by the conventional two-channel system and to provide a better than conventional signal quality throughout such larger area, said transmitter comprising:

means for combining independent stereophonically related audio frequency source signals L and R to obtain audio frequency sum and difference signals M and S respectively comprising (L+R) and (L−R), means for compressing the dynamic range of said difference signal S to obtain a compressed difference signal S', means for modulating each of two sub-carriers with a respective one of said difference signals S and said compressed difference signal S', and means for modulating said sum signal M and the aforementioned modulated sub-carrier signals onto a high frequency carrier for the purpose of transmitting the same to one or more remote receivers.

11. A transmitter as defined in claim 10, wherein said two sub-carriers have the same frequency and are spaced 90° apart in phase and are amplitude-modulated to develop two double-sideband suppressed carrier signals, the frequency of said sub-carriers being sufficiently high to insure a frequency gap between the lower sidebands of the modulated sub-carrier signals and the sum signal M, wherein said transmitter further comprises means for generating a phase reference pilot signal having a frequency one-half that of said sub-carriers and which lies within said frequency gap, and wherein said means for modulating a high frequency carrier also modulates said pilot signal onto said high frequency carrier.

12. A receiver for use with the transmitter defined by claim 10 and which is compatible with conventional monophonic and two-channel FM broadcasts, said receiver comprising:

means responsive to reception of said high frequency carrier for deriving said sum signal M, said difference signal S and said compressed difference signal S', means for complementarily expanding the derived compressed difference signal S' to obtain an expanded noise-reduced version of the difference signal, means for combining the expanded noise-reduced version of the difference signal with said derived sum signal M to obtain each of said source signals L and R, and switch means for alternatively applying said derived difference signal S, instead of the expanded version of the difference signal, to the receiver combining means for enabling said receiver to reproduce conventional two-channel FM broadcasts.

13. A receiver for use with the transmitter defined by claim 11 and which is compatible with conventional monophonic and two-channel FM broadcasts, said receiver comprising:

means responsive to reception of said high frequency carrier for deriving said sum signal M, said difference signal S and said compressed difference signal S', means for complementarily expanding the derived compressed difference signal S' to obtain an expanded noise-reduced version of the difference signal, means for combining said expanded version of the difference signal with said derived sum signal M to obtain each of said source signals L and R, and switch means for alternatively applying said derived difference signal S, instead of the expanded version of the difference signal, to the receiver combining means for enabling said receiver to reproduce conventional two-channel FM broadcasts.

14. An improved FM radio broadcast system including a transmitter and at least one remote receiver which is compatible with conventional monophonic and two-channel stereophonic broadcasts and in which the transmitter is capable of reaching a larger listening area than can be reached by the conventional two-channel system and of providing a better than conventional signal quality throughout such larger listening area, said system comprising:

at the transmitter means for combining independent stereophonically related audio frequency source signals L and R to obtain audio frequency sum and difference signals M and S respectively comprising (L+R) and (L−R), means for compressing the dynamic range of said difference signal to obtain a compressed difference signal, means for modulating each of two sub-carriers with said difference signal and with said compressed difference signal, respectively, and means for modulating said sum signal M and the said modulated sub-carrier signals onto a high frequency carrier for the purpose of transmitting the same to one or more remote receivers; and at the receiver means for deriving from a received modulated high frequency carrier said sum signal M, said difference signal, and said compressed difference signal, means for complementarily expanding the derived compressed difference signal to obtain an expanded noise-reduced version of the difference signal, means for combining said expanded noise-reduced version of the difference signal with said sum signal to obtain each of said source signals L and R, and switch means for alternatively applying said difference signal, instead of the expanded noise-reduced version of the difference signal, to the receiver combining means for enabling said receiver to reproduce conventional two-channel FM broadcasts.

15. An improved FM radio broadcast system as defined in claim 14, wherein said sub-carriers have the same frequency and are spaced 90° apart in phase and are amplitude-modulated by said difference signal and by said compressed difference signal, respectively, to develop two double-sideband suppressed-carrier signals, the frequency of said subcarriers being sufficiently high to insure a frequency gap between the lower sidebands of the modulated sub-carrier signals and the sum signal, wherein the transmitter further comprises means for generating a phase reference pilot signal having a frequency one-half that of said sub-carriers and which lies within said frequency gap, and wherein said means for modulating a high frequency carrier also modulates said pilot signal onto said high frequency carrier, and wherein the means at the receiver for deriving the sum, difference and compressed difference signals includes means for also deriving said phase reference pilot signal.

16. A transmitter for a biphonic FM radio transmission system for transmitting independent stereophonically related audio frequency waves L and R, comprising:

combining means for combining the L and R waves to obtain an audio frequency sum wave M corresponding to L+R and an audio frequency difference wave S corresponding to L−R;

compressing means connected to said combining means for compressing the dynamic range of said audio frequency difference wave S to produce a compressed difference wave S';

generating means for generating two sub-carriers of the same frequency and spaced 90° apart in phase and a pilot signal having a frequency which is one half the frequency of the sub-carrier;

amplitude-modulating means connected to said generating means, said compressing means and said combining means for amplitude-modulating each sub-carrier with a respective one of said difference and compressed difference waves S and S' to develop two double-sideband suppressed-carrier signals, the frequency of said sub-carriers being sufficiently high as to ensure a frequency gap between the frequency bandwidth of the modulated sub-carrier signals and the frequency bandwidth of the audio frequency sum wave M, with the frequency of the pilot signal being located within said frequency gap; and frequency modulating means connected for frequency modulating the modulated sub-carrier signals and the audio frequency sum wave M onto a high frequency carrier for the purpose of transmitting the modulated high frequency carrier to at least one remote receiver.

17. A biphonic FM radio transmission system comprising, in combination:

a transmitter as defined in claim 16, and a receiver including deriving means for receiving said frequency modulated high frequency carrier and for deriving said sum wave M, said difference wave S and said compressed difference wave S';

expanding means connected to said receiving means for complementarily expanding the dynamic range of said derived compressed difference wave S' to produce an expanded S' wave which has a dynamic range corresponding to the dynamic range of the S wave; and further combining means connected to said receiving means and said expanding means for combining said expanded S' wave with the derived sum wave M to obtain each of the audio frequency waves L and R.

18. A biphonic FM radio transmission system as defined in claim 17, wherein said receiver further includes switch means connected to said further combining means, said deriving means and said expanding means for selectively coupling a selected one of said derived difference wave S and said expanded S' wave to said further combining means.

19. A biphonic FM radio transmission system for broadcasting independent stereophonically related audio frequency signals L and R, comprising:

a transmitter including first combining means for combining the signals L and R to obtain audio frequency sum and difference signals M and S respectively comprising (L+R) and (L−R);

compressing means connected to said combining means for compressing the dynamic range of said difference signal S to produce a compressed difference signal S';

first modulating means connected for receiving two equal frequency quadrature-phased sub-carriers and for amplitude modulating each sub-carrier with a respective one of said difference and compressed difference signals S and S'; and second modulating means connected for frequency modulating the aforementioned amplitude-modulated sub-carrier signals and said sum signal M onto a high frequency carrier for the purpose of transmitting the same to at least one remote receiver; and at least one remote receiver including deriving means for receiving said frequency-modulated high frequency carrier and for deriving said sum signal M, said difference signal S, and said compressed difference signal S';

expanding means connected to said deriving means for complementarily expanding said derived compressed difference signal S' to obtain an expanded noise-reduced version of the difference signal S; and second combining means connected to said deriving means and said expanding means for combining the expanded noise-reduced version of the difference signal S with the derived sum signal M to obtain each of said source signals L and R.

20. A biphonic FM radio transmission system as defined in claim 19, wherein said receiver further includes switch means connected to said deriving means, said expanding means and said second combining means for selectively coupling a selected one of the derived difference signal S and the expanded version of the difference signal S to said second combining means.

* * * * *